United States Patent
Su et al.

(10) Patent No.: US 11,310,938 B2
(45) Date of Patent: Apr. 19, 2022

(54) LEAK SENSOR DRIP TRAY

(71) Applicant: Dell Products, L.P., Round Rock, TX (US)

(72) Inventors: Iou Ren Su, Keelung (TW); William Kenneth Coxe, III, Round Rock, TX (US)

(73) Assignee: Dell Products, L.P., Round Rock, TX (US)

(*) Notice: Subject to any disclaimer, the term of this patent is extended or adjusted under 35 U.S.C. 154(b) by 0 days.

(21) Appl. No.: 16/896,720

(22) Filed: Jun. 9, 2020

(65) Prior Publication Data

US 2021/0385970 A1 Dec. 9, 2021

(51) Int. Cl.
*H05K 7/20* (2006.01)
*G01M 3/32* (2006.01)
*G06F 1/20* (2006.01)

(52) U.S. Cl.
CPC ...... *H05K 7/20272* (2013.01); *G01M 3/3263* (2013.01); *G06F 1/20* (2013.01); *H05K 7/20254* (2013.01)

(58) Field of Classification Search
None
See application file for complete search history.

(56) References Cited

U.S. PATENT DOCUMENTS

| | | | |
|---|---|---|---|
| 9,943,016 B2* | 4/2018 | Pietrantonio | H05K 7/20927 |
| 10,168,749 B2* | 1/2019 | Aoki | H01L 23/40 |
| 10,238,010 B2* | 3/2019 | Shelnutt | H05K 7/20836 |
| 10,645,847 B2* | 5/2020 | Edwards | H05K 7/20809 |
| 10,772,187 B2* | 9/2020 | Mitsui | H05K 7/203 |
| 2011/0313576 A1* | 12/2011 | Nicewonger | F28D 15/00 700/282 |
| 2013/0058038 A1* | 3/2013 | Alyaser | H05K 7/20254 361/679.53 |
| 2015/0131224 A1* | 5/2015 | Barina | G06F 1/20 361/679.53 |
| 2017/0181321 A1* | 6/2017 | Shelnutt | H05K 7/20781 |
| 2019/0239386 A1* | 8/2019 | Chen | H05K 7/20772 |
| 2020/0103307 A1 | 4/2020 | Farkas et al. | |
| 2020/0340767 A1* | 10/2020 | Holden | G01M 3/186 |
| 2021/0068303 A1* | 3/2021 | Franz | G05B 19/042 |
| 2021/0112686 A1* | 4/2021 | Dogruoz | H01L 23/427 |

* cited by examiner

*Primary Examiner* — Courtney L Smith
(74) *Attorney, Agent, or Firm* — Fogarty LLP

(57) ABSTRACT

Systems and methods are provided for a leak sensor drip tray. In some embodiments, an Information Handling System (IHS) may include: a component; a cold plate disposed above the component; a leak sensor board disposed above the cold plate; and a drip tray disposed above the leak sensor, wherein the drip tray is configured to capture a fluid leak from a fitting coupled to the cold plate.

8 Claims, 10 Drawing Sheets

LEAK SENSOR DRIP TRAY

FIELD

This disclosure relates generally to Information Handling Systems (IHSs), and more specifically, to systems and methods for a leak sensor drip tray.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

In recent years, as IHS components such as processors, graphics cards, random access memory (RAM), etc. have increased in clock speed and power consumption, the amount of heat produced by such components during normal operation has also increased. Often, the temperatures of these components need to be kept within a selected range to prevent overheating, instability, malfunction and damage leading to a shortened component lifespan. Accordingly, cooling systems are often used in IHSs to cool certain components.

To control the temperature of components of an IHS, an approach may include using a "passive" cooling system that serves to reject heat of a component to air driven by one or more system-level air movers (e.g., fans, blowers, etc.). A different approach may include using an "active" cooling system in which a heat-exchanging cold plate is thermally coupled to the IHS component, and a chilled fluid is passed through conduits internal to the cold plate to remove heat from that component.

As the inventors hereof have recognized, however, a disadvantage to using liquid cooling is that components of the liquid cooling system (e.g., fluid fittings, fluid joints, hoses or other fluidic conduits, pumps, cold plates, etc.) often develop leaks over time due to vibration, thermal cycles, and/or aging. Liquid leaks within an IHS may cause corrosion to components of the IHS and/or damage to electrical or electronic circuitry of the IHS.

SUMMARY

Systems and methods for implementing a leak sensor drip tray. In an illustrative, non-limiting embodiment, an Information Handling System (IHS) may include: a component; a cold plate disposed above the component; a leak sensor board disposed above the cold plate; and a drip tray disposed above the leak sensor, wherein the drip tray is configured to capture a fluid leak from a fitting coupled to the cold plate.

For example, the component may include at least one of: a processor, a graphics card, or a Random Access Memory (RAM). The drip tray may include at least one hole configured to receive the fitting. Moreover, the drip tray may have a concave shape. The leak sensor board may include a microstrip differential trace moisture sensor. The drip tray may include at least one drain configured to guide the fluid leak from the fitting toward the microstrip differential trace moisture sensor.

Additionally, or alternatively, the drip tray may include at least another drain configured to guide another fluid leak from another fitting toward another microstrip differential trace moisture sensor on the leak sensor board. In some case, the drip tray further may include a lateral wall configured to guide air flow from a fan into a dual in-line memory module (DIMM) area.

In another illustrative, non-limiting embodiment, a drip tray may include: a concave surface; a hole configured to receive a fitting coupled to a cold plate; and a drain configured to guide a fluid leak from the fitting toward a leak sensor board disposed between the cold plate and the drip tray.

In yet another illustrative, non-limiting embodiment, a method may include: positioning a drip tray over a leak sensor board disposed atop a cold plate configured to cool a component of the IHS, wherein the drip tray has a concave shape; and fastening the drip tray to the IHS.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

In various embodiments, systems and methods described herein include a leak sensor drip tray. The inventors hereof have determined during the development of leak sensing solutions for liquid cooling systems, that a likely point of failure (where a leak may be found) is at material joints. In most cases, a material joint is a hose fitting to a cold plate, or where a copper heat sink base is sealed to a plastic upper manifold section of the cold plate.

To address these problems, systems and methods described herein focus on protecting components of an Information Handling System (IHS) against failures at hose joint fittings and adds an air shroud/drip tray above a cold plate with a leak sense board between the cold plate and drip tray. In some cases, instead of the drip tray being placed above the entire assembly, the drip tray may be placed between the fluid connections and the leak sense board. The top surface of the drip tray may be given a concave shape with an opening or drain at the bottom of the bowl.

The drain funnels any leaking fluid to this lowest point, where the leak sense board is placed (and possibly sealed) to the drip tray. The funneling enables any leaks to reach the drain and to be focused on a sensor and/or specific area of the leak sensor board, thus providing an opportunity to minimize the size of the leak sensor board. In some cases, the drip tray may be manufactured with any plastic, metal, alloy, or other suitable material.

For purposes of this disclosure, an Information Handling System (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Figure 1:
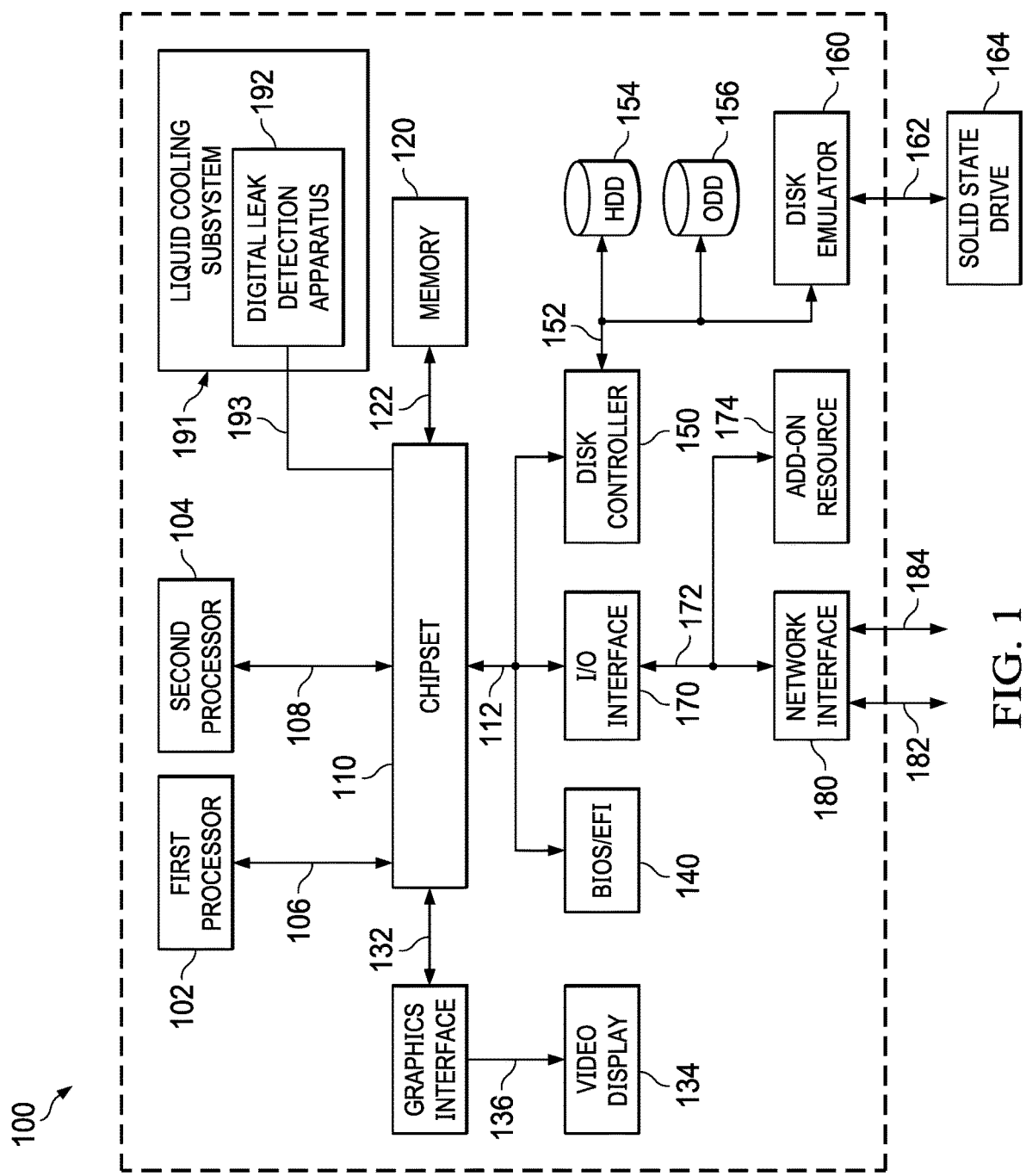
FIG. 1 is a block diagram illustrating an example of components of an Information Handling System (IHS), according to some embodiments.

FIG. 1 illustrates an example of components of IHS 100. Particularly, IHS 100 may include devices, components, or modules that embody one or more of the systems and/or performs one or more of the methods described herein. As shown, IHS 100 includes a processors 102 and 104, chipset 110, memory 120, graphics interface 130, basic input and output system/extensible firmware interface (BIOS/EFI) module 140, disk controller 150, disk emulator 160, input/output (I/O) interface 170, network interface 180, and liquid cooling subsystem 191.

Processor 102 is connected to chipset 110 via processor interface 106, and processor 104 is connected to chipset 110 via processor interface 108. Memory 120 is connected to chipset 110 via memory bus 122. Graphics interface 130 is connected to chipset 110 via a graphics interface 132, and provides video display output 136 to video display 134. In a particular embodiment, IHS 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/EFI module 140 includes BIOS/EFI code operable to detect resources within IHS 100, to provide drivers for the resources, initialize the resources, and access the resources. BIOS/EFI module 140 includes code that operates to detect resources within IHS 100, to provide drivers for the resources, to initialize the resources, and to access the resources.

Disk controller 150 includes a disk interface 152 that connects the disc controller to hard disk drive (HDD) 154, to optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits solid-state drive 164 to be connected to IHS 100 via external interface 162. An example of external interface 162 includes a USB interface, an IEEE 1194 (Firewire) interface, a proprietary interface, or a combination thereof. Alternatively, solid-state drive 164 can be disposed within IHS 100.

I/O interface 170 includes a peripheral interface 172 that connects the I/O interface to add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within IHS 100, a device that is external to the information handling system, or a combination thereof.

Network interface 180 represents a NIC disposed within IHS 100 on a main circuit board of IHS 100, integrated onto another component such as chipset 110, in another suitable location, or a combination thereof. Network interface device 180 includes network channels 182 and 184 that provide interfaces to devices that are external to IHS 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another IHS, a data storage system, another network, a grid management system, another suitable resource, or a combination thereof.

Liquid cooling subsystem 191 comprises digital leak detection apparatus 192. Digital leak detection apparatus 192 is connected to chipset 110 via interface 193.

As CPU power continues to increase, liquid cooling is expected to be more common. Liquid cooling systems circulate water in a closed loop inside electronics enclosures, which include fittings and joints and hoses to complete the loop. These parts can develop leaks over time due to vibration, thermal cycles or aging. Any leaks would result in water in the system that can cause corrosion or damage to circuitry, therefore a method and apparatus to detect leaks are provided as described herein.

In accordance with at least one embodiment, inexpensive and reliable moisture sensors using resistively driven exposed circuit board traces can be assessed using digital signal processing (DSP) to detect leaks. This can provide a very low cost and reliable solution. A microstrip differential trace sensing element is fabricated and placed at an area that is likely prone to leaks. As an example, this may be near the hose fittings and/or near a drain of a drip tray, as described in more detail below. The moisture sensing trace is not covered by solder mask so it can be exposed to leaking coolant and humidity from air. In the presence of water, the impedance across the traces decreases.

To cancel out variations in components and board manufacturing and humidity changes in the environment, a second microstrip differential element is provided and is used as reference. This moisture sensing trace will be placed where a leak is not expected. This trace is not covered by solder mask so it can be exposed to humidity from air.

In accordance with at least one embodiment, exposed traces may be gold plated to prevent corrosion. One trace of each pair may be connected to a reference potential, such as a ground voltage, so voltages can be measured with single ended measurements from a low-cost microcontroller unit (MCU).

Both pairs are driven from the MCU through a resistance-capacitance (RC) low-pass filter and a resistor, forming a voltage divider with the sensors. Water is slightly conductive, so wet traces have lower impedance. Two analog-to-digital converters (ADCs) sample the voltage on the traces. MCU firmware (FW) is executed by the MCU to monitor the change of peak voltages that correlate to impedances. The MCU compares readings between sensors, and asserts an alert if there is a leak.

A circuit board for the digital leak detection apparatus may be installed on a base plate, such as a cold plate. The coolant contains surfactant additives that cause the liquid to spread quickly once in contact with the printed circuit board (PCB). The sensor traces are grouped into zones that correspond to areas isolated from one another, for example, using solder masking, silk screen printing, or both, on the upper surface of the circuit board to establish barriers between the areas to discourage fluid travel across zones, in order to maximize the delta between sensors.

Figure 2:
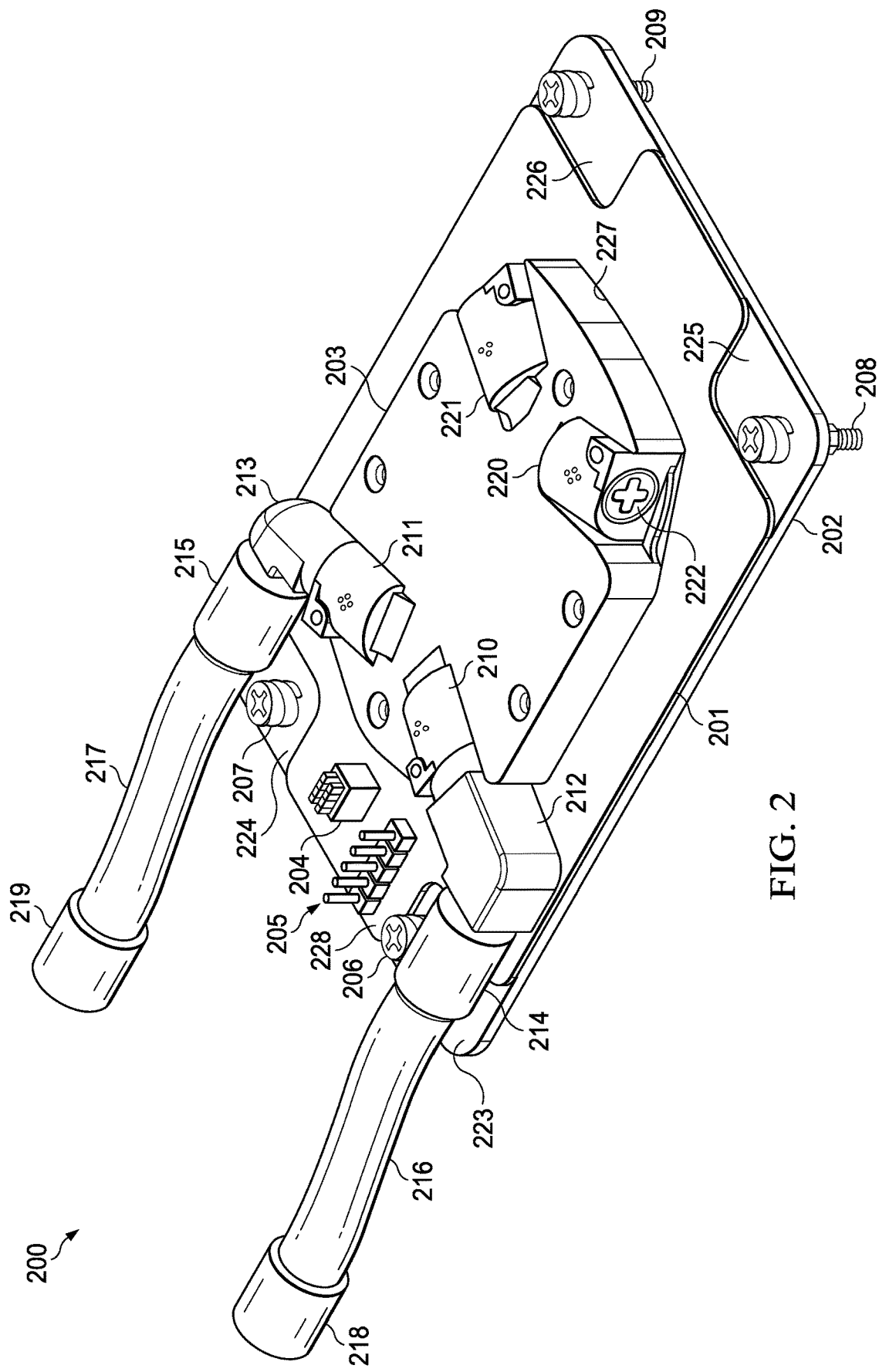
FIG. 2 is a perspective view of a liquid cooling subsystem for an IHS, the liquid cooling subsystem including a digital leak detection apparatus, according to some embodiments.

FIG. 2 is a perspective view diagram illustrating a liquid cooling subsystem for IHS 100, the liquid cooling subsystem comprising a digital leak detection apparatus according to some embodiments. Liquid cooling subsystem 200 comprises a digital leak detection apparatus situated on circuit board 201, a base plate 202, a heat exchanger 203, electronic device 204, electrical connector 205, mounting screw 206, mounting screw 207, mounting screw 208, mounting screw 209, coolant fitting 210, coolant fitting 211, coolant elbow 212, coolant elbow 213, coolant fitting 214, coolant fitting 215, coolant tube 216, coolant tube 217, coolant fitting 218, coolant fitting 219, coolant fitting 220, coolant fitting 221, and coolant plug 222. The corners of circuit board 201, which may have an otherwise rectangular outer perimeter, may be relieved, for example with substantially rectangular reliefs, to give circuit board 201 more of plus-sign-shaped ("+") outer perimeter. The corner reliefs may allow portions 223, 224, 225, and 226 of base plate 202 to be exposed. Circuit board 201 defines an opening 227 through its central portion through which heat exchanger 203 may extend. Electronic circuitry, such as electronic device 204 and electrical connector 205 are located on a portion 228 of circuit board 201.

A liquid path through liquid cooling subsystem 200 extends from coolant fitting 208, through coolant tube 216, through coolant fitting 214, through coolant elbow 212, through coolant fitting 210, through heat exchanger 203, through coolant fitting 211, through coolant elbow 213, through coolant fitting 215, through coolant tube 217, and through coolant fitting 219. Coolant fittings 220 and 221 may be plugged, such as with coolant plug 222, shown plugging coolant fitting 220, or the plugs may be removed and coolant fittings, elbows, and tubes may be connected to coolant fittings 220 and 221.

Mounting screws 206, 207, 208, and 209 may extend through holes defined in the corners of base plate 202, for example, through corner reliefs defined around the perimeter of circuit board 201. The axes of mounting screws 206, 207, 208, and 209 may be perpendicular to the plane of base plate 202. Circuit board 201 may be in a plane parallel to the plane of base plate 202. The plane of circuit board 201 may be adjacent above the plane of base plate 202. Circuit board 201 may be attached to base plate 202, for example, using an adhesive. Coolant plumbing components, such as coolant elbows 212 and 213 and coolant fittings 214 and 215 may overlie portions of circuit board 201 and base plate 202.

Figure 3:
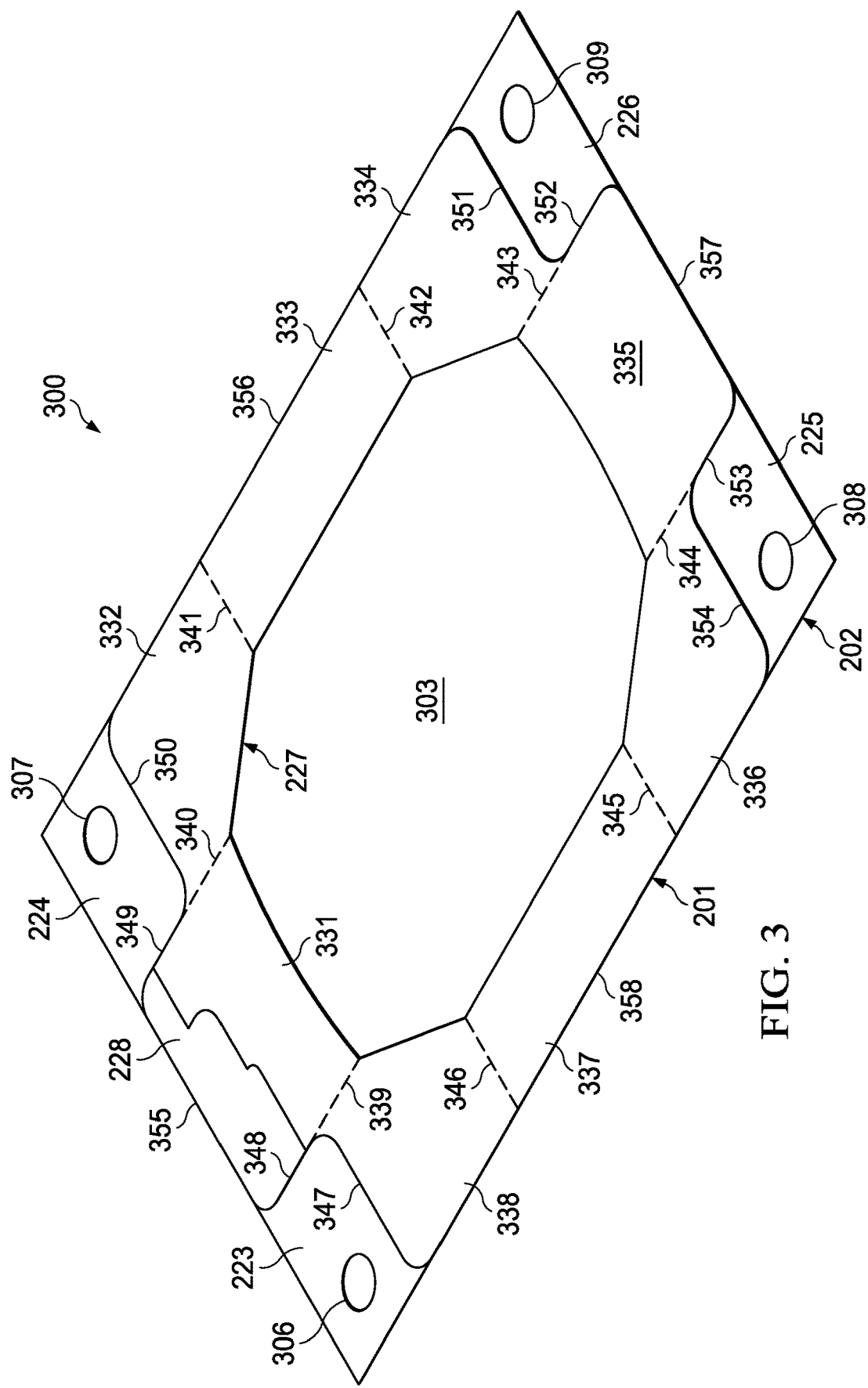
FIG. 3 is a perspective view of a digital leak detection apparatus, according to some embodiments.

FIG. 3 is a perspective view diagram illustrating a digital leak detection apparatus according to some embodiments. Digital leak detection apparatus 300 is fabricated on circuit board 201. For clarity, circuit board 201 is shown on base plate 202 in absence of the other elements shown in FIG. 2. Holes 306, 307, 308, and 309, defined in the corners of base plate 202, through which mounting screws 206, 207, 208, and 209 passed in FIG. 2, can be seen in FIG. 3. Portions 223, 224, 225, and 226 of base plate 202 can be seen through the corner reliefs defined around the perimeter of circuit board 201.

The corner reliefs may be created for circuit board 201, for example, by using a routing tool to cut edges 347, 348, 349, 350, 351, 352, 353, and 354 of circuit board 201. Edges 355, 356, 357, and 358 of circuit board 201, which may align with edges of base plate 202, span lengths between the corner reliefs. Opening 227 defined in circuit board 201 is fully visible in FIG. 3. Opening 227 may also be defined in base plate 202. Hole 303 defined by opening 227 is visible in FIG. 3. Portion 228 of circuit board 201, in which electric components may be situated, may be set apart from portions of circuit board 201 in which sensing trace regions may be defined.

For example, sensing trace regions 331, 332, 333, 334, 335, 336, 337, and 338 may be defined on an upper surface of circuit board 201. Boundary 339 is defined between sensing trace regions 338 and 331. Boundary 340 is defined between sensing trace regions 331 and 332. Boundary 341 is defined between sensing trace regions 332 and 333. Boundary 342 is defined between sensing trace regions 333 and 334. Boundary 343 is defined between sensing trace regions 334 and 335. Boundary 344 is defined between sensing trace regions 335 and 336. Boundary 345 is defined between sensing trace regions 336 and 337. Boundary 346 is defined between sensing trace regions 337 and 338.

Figure 4:
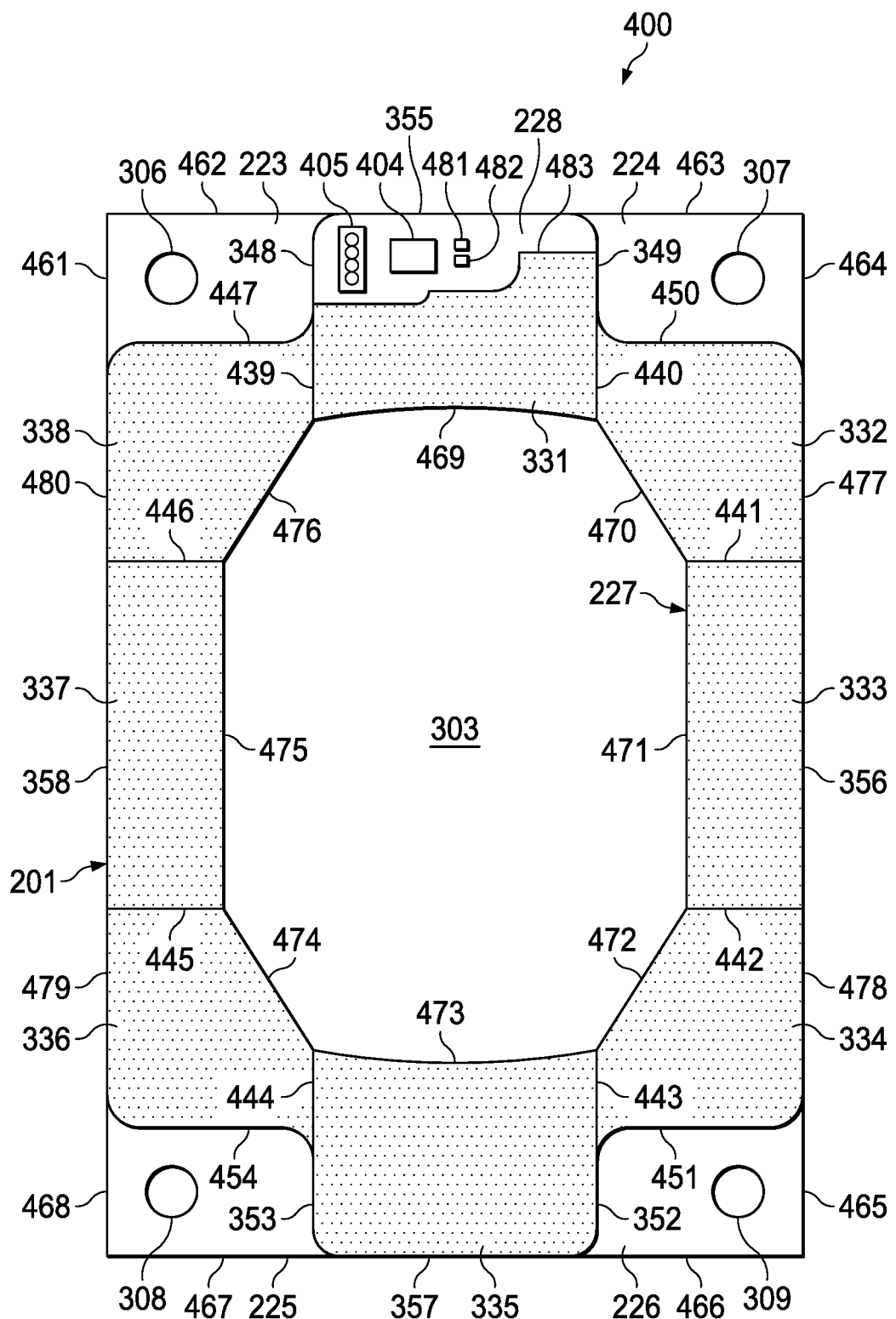
FIG. 4 is a plan view of a digital leak detection apparatus, according to some embodiments.

FIG. 4 is a plan view diagram illustrating a digital leak detection apparatus according to an embodiment of the present disclosure. Digital leak detection apparatus 400 is fabricated on circuit board 201. An upper surface of circuit board 201 is visible. Portions 223, 224, 225, and 226 of base plate 202 are visible through the corner reliefs of circuit board 201. Holes 306, 307, 308, and 309 defined in base plate 202 are visible in portions 223, 224, 225, and 226, respectively, of base plate 202. Edges 348, 349, 352, and 353 of the corner reliefs of circuit board 201 are shown.

Edge 355 of circuit board 201 is shown aligned with edge 462 of portion 223 of base plate 202 and with edge 463 of portion 224 of base plate 202. Edge 356 of circuit board 201 is shown aligned with edge 464 of portion 224 of base plate 202 and with edge 465 of portion 226 of base plate 202. Edge 357 of circuit board 201 is shown aligned with edge 466 of portion 226 of base plate 202 and with edge 467 of portion 225 of base plate 202. Edge 358 of circuit board 201 is shown aligned with edge 468 of portion 225 of base plate 202 and with edge 461 of portion 223 of base plate 202.

Opening 227 defined in circuit board 201 is shown as being defined by edges along which barriers 469, 471, 473, and 475 lie, as well as along edges 470, 472, 474, and 476, along which barriers may or may not be provided. Hole 303 defined by opening 227 is visible in FIG. 4. Barrier 447 lies along edge 347. Barrier 450 lies along edge 350. Barrier 451 lies along edge 351. Barrier 454 lies along edge 354. Barrier 439 lies along boundary 339. Barrier 440 lies along boundary 340. Barrier 441 lies along boundary 341. Barrier 442 lies along boundary 342. Barrier 443 lies along boundary 343. Barrier 444 lies along boundary 344. Boundary 445 lies along boundary 345. Boundary 446 lies along boundary 346. Barriers 447 and 478 lie along edge 356. Barriers 479 and 480 lie along edge 358.

Barriers 439, 469, 440, 450, 477, 441, 471, 442, 451, 443, 473, 444, 454, 479, 445, 475, 446, 480, and 447 are connected in series to form a contiguous barrier separating sensing trace regions 331, 332, 333, 334, 335, 336, 337, and 338 from one another. Portion 228 of circuit board 201 is shown with pads 404, 481, and 482 upon which electrical components may be soldered and pads 405 upon which connector 205 may be soldered. A boundary 483 is defined between portion 228 of circuit board 201 and sensing trace region 331 of circuit board 201.

Figure 5:
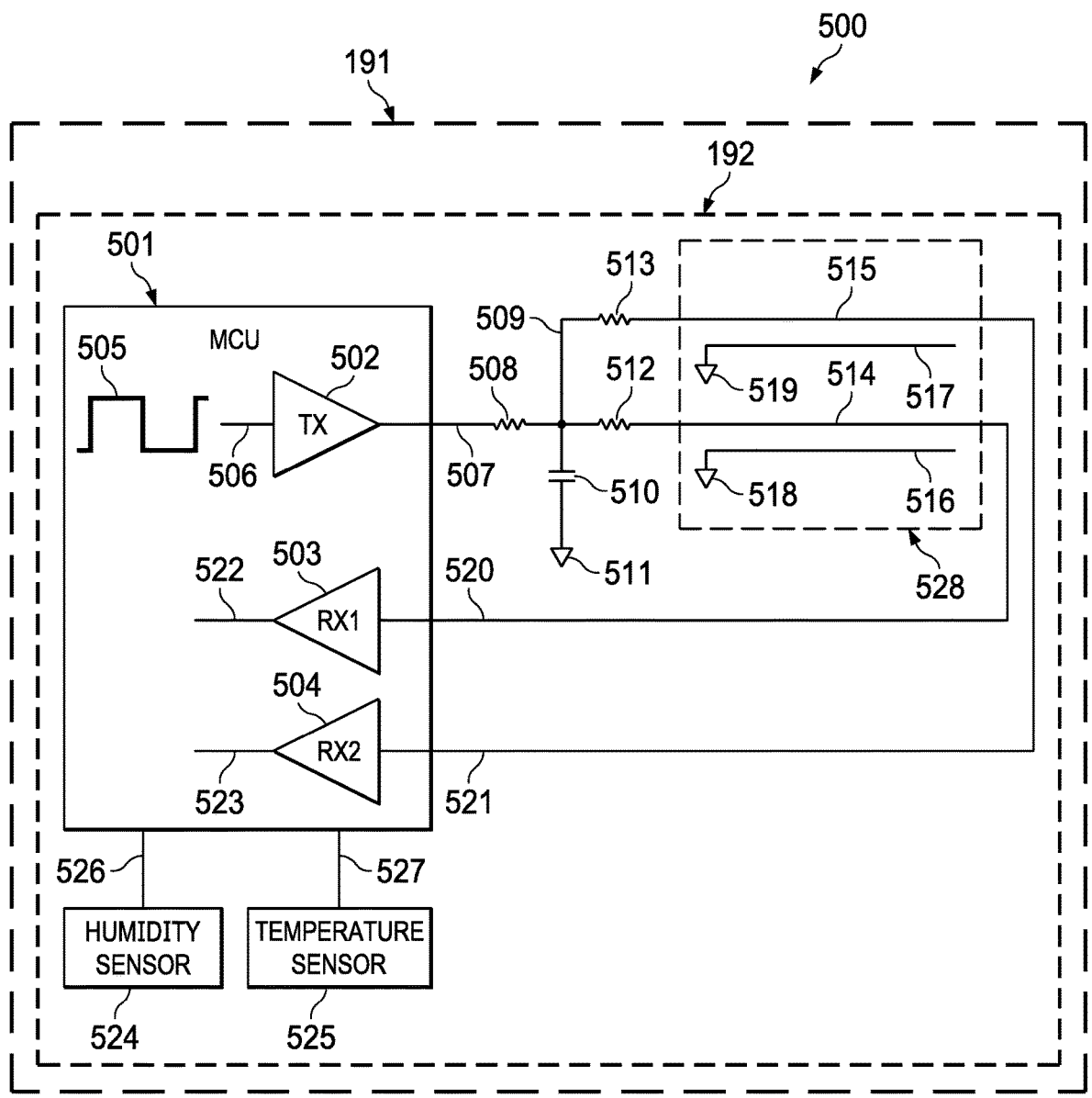
FIG. 5 is a schematic diagram illustrating a digital leak detection apparatus, according to some embodiments.

FIG. 5 is a schematic diagram illustrating a digital leak detection apparatus according to some embodiments. Circuitry 500 is shown within digital leak detection apparatus 192, which is shown within liquid cooling subsystem 191. Circuitry 500 comprises a processor, such a microcontroller unit (MCU) 501, resistor 508, capacitor 510, impedance devices 512 and 513, sensing traces 514 and 515, reference sensing traces 516 and 517, humidity sensor 524, and temperature sensor 525. MCU 501 comprises transmitter 502, first receiver 503, and second receiver 504.

Waveform 505 is provided at transmitter input 506 of transmitter 502. Transmitter 502 provides transmitter output 507 to a first terminal of resistor 508. Second terminal of resistor 508 is connected, at node 509, to a first terminal of capacitor 510, to a first terminal of impedance device 512, and to a first terminal of impedance device 513. Second terminal of capacitor 510 is connected to reference potential 511. Impedance devices 512 and 513 may, for example, be resistors or may, for example, be other devices providing impedance.

Microstrip differential trace moisture sensor 528 comprises sensing traces 514 and 515 and reference sensing traces 516 and 517. Second terminal of impedance device 512 is connected to a first end of sensing trace 514. Second terminal of impedance device 513 is connected to a first end of sensing trace 515. Sensing trace 514 is configured to lie parallel within the plane of the upper surface of circuit board 201 to reference sensing trace 516. Such parallelism may be obtained, for example, by multiple parallel segments of sensing trace 514 and reference sensing trace 516.

A first end of reference sensing trace is connected to reference potential 518. Sensing trace 515 is configured to lie parallel within the plane of the upper surface of circuit board 201 to reference sensing trace 517. Such parallelism may be obtained, for example, by multiple parallel segments of sensing trace 515 and reference sensing trace 517. A first end of reference sensing trace is connected to reference potential 519. A second end of sensing trace 514 is connected to receiver input 520 of receiver 503. Receiver 503 provides receiver output 522. A second end of sensing trace 515 is connected to receiver input 521 of receiver 504. Receiver 504 provides receiver output 523. MCU 501 may be connected to one or more of humidity sensor 524 via humidity input 526 and temperature sensor 525 via temperature input 527.

The drive impedance at which the transmitter (and low-pass filter) drive the moisture sensor can be selected to optimize signal strength and discrimination between a high humidity level and a leak. The spacing of the differential traces can be selected to optimize signal strength and discrimination between a high humidity level and a leak. In accordance with at least one embodiment, an additional receiver can be provided to receive a receiver input from a twisted leak detect cable, which can be used, for example, to cover remote areas of the information handling system (IHS) chassis.

In various embodiments, the sensor impedance is dependent on water content (including humidity), frequency, and temperature. Sensor response when driven with a direct-current (DC) signal can make discrimination of a signal obtained from a coolant leak vs. a signal obtained from high humidity difficult. In accordance with at least one embodiment, superior performance is provided by using an alternating-current (AC) signal to drive the sensors. As an example, using an AC waveform to drive the moisture sensors, sensor response under American Society of Heating, Refrigerating, and Air-Conditioning Engineers (ASHRAE) A4 specifications with 70% relative humidity (RH) at 35 degrees Celsius provides attenuation associated with a leak that is significantly larger than that associated with the humidity alone, and a leak can be easily detected. In accordance with at least one embodiment, even at 35 degrees Celsius and 90% RH, such a high level of humidity can be differentiated from a leak event with a measurement difference of at least three decibels (dB).

In various embodiments, the transmitter drives both sensors with the same signal and measures them with the receivers simultaneously. In accordance with at least one embodiment, the geometry and length of the sensor traces are matched, so the measured signals are similar, independent of humidity and temperature, unless there is a leak. In case of a leak, the sensors provide unbalanced output signals and the processor will detect the difference in the amplitudes.

In the unlikely case where a large leak hits both sensors at the exact same time and covers the same amount of trace length, the readings would remain similar. To cover this corner case, the processor may also look at the trend of the absolute values as well, not just relative values between sensors. Slow changes (e.g., those occurring over seconds) indicate humidity variations in the environment. Fast declines of both signal amplitudes indicate a large leak that covers both sensors. Optional humidity and temperature sensors are available on-board as tie-breaker. The output of this the humidity and temperature sensors can also be used to implement a black box feature, recording a history of humidity in the system.

Figure 6:
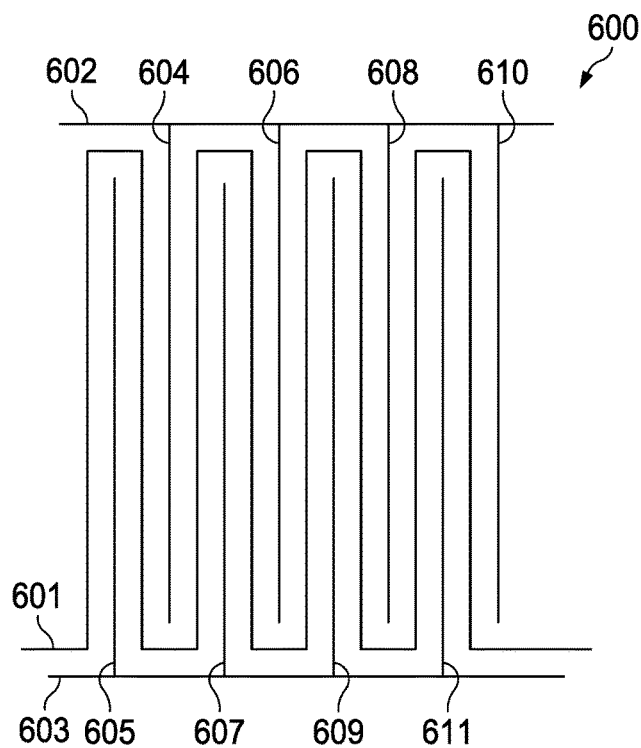
FIG. 6 is a block diagram illustrating a microstrip differential trace moisture sensor for a digital leak detection apparatus, according to some embodiments.

FIG. 6 is a block diagram illustrating a microstrip differential trace moisture sensor for a digital leak detection apparatus according to some embodiments. Microstrip differential trace moisture sensor 600 provides interdigitated reference sensing traces through which sensing trace 601 meanders. First common reference potential interconnect 602 is connected to reference sensing traces 604, 606, 608, and 610. Second common reference potential interconnect 603 is connected to reference sensing traces 605, 607, 609, and 611.

Reference sensing traces 604, 606, 608, and 610 serve as a first set of digitated reference sensing traces. Reference sensing traces 605, 607, 609, and 611 serve as a second set of digitated reference sensing traces disposed so as to interdigitate in opposition to the first set of digitated reference sensing traces. Sensing trace 601 follows a meandering path between the first and second sets of digitated reference sensing traces. The path of sensing trace 601 may be equidistant from the first and second sets of digitated reference sensing traces.

Sensing trace 601, reference sensing traces 604, 605, 606, 607, 608, 609, 610, and 611, and common reference potential interconnects 602 and 603 may be instantiated on the upper surface of circuit board 201 as metallic traces, such as copper traces. The metallic traces may be plated, for example, gold plated.

Figure 7:
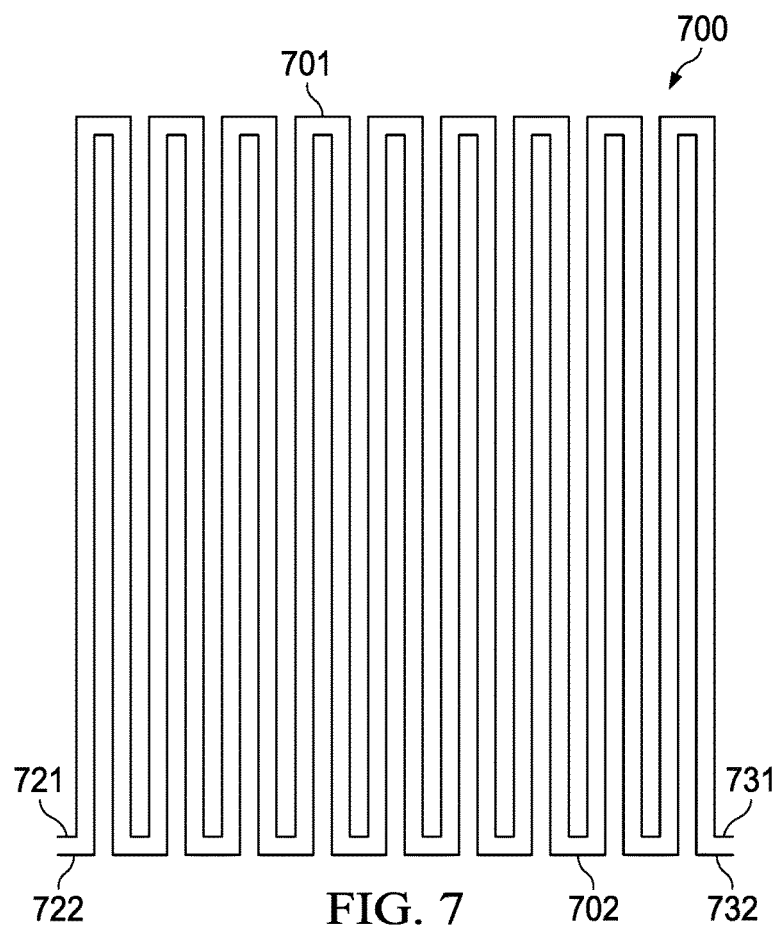
FIG. 7 is a block diagram illustrating microstrip differential trace moisture sensor for a digital leak detection apparatus, according to some embodiments.

FIG. 7 is a block diagram illustrating microstrip differential trace moisture sensor for a digital leak detection apparatus according to some embodiments. Microstrip differential trace moisture sensor 700 provides a meandering reference sensing trace 702, which lies parallel in the plane of the upper surface of circuit board 201 to the meandering sensing trace 701. Sensing trace 701 follows its meandering path from a first end 721 to a second end 731. Reference sensing trace 702 follows its meandering path from a first end 722 to a second end 732. Reference sensing trace 702 is interposed with sensing trace 701. Sensing trace 701 and reference sensing trace 702 follow parallel meandering paths. The path of sensing trace 701 may be equidistant from the path of reference sensing trace 702. Sensing trace 701 and reference sensing trace 702 may be instantiated on the upper surface of circuit board 201 as metallic traces, such as copper traces. The metallic traces may be plated, for example, gold plated.

Figure 8:
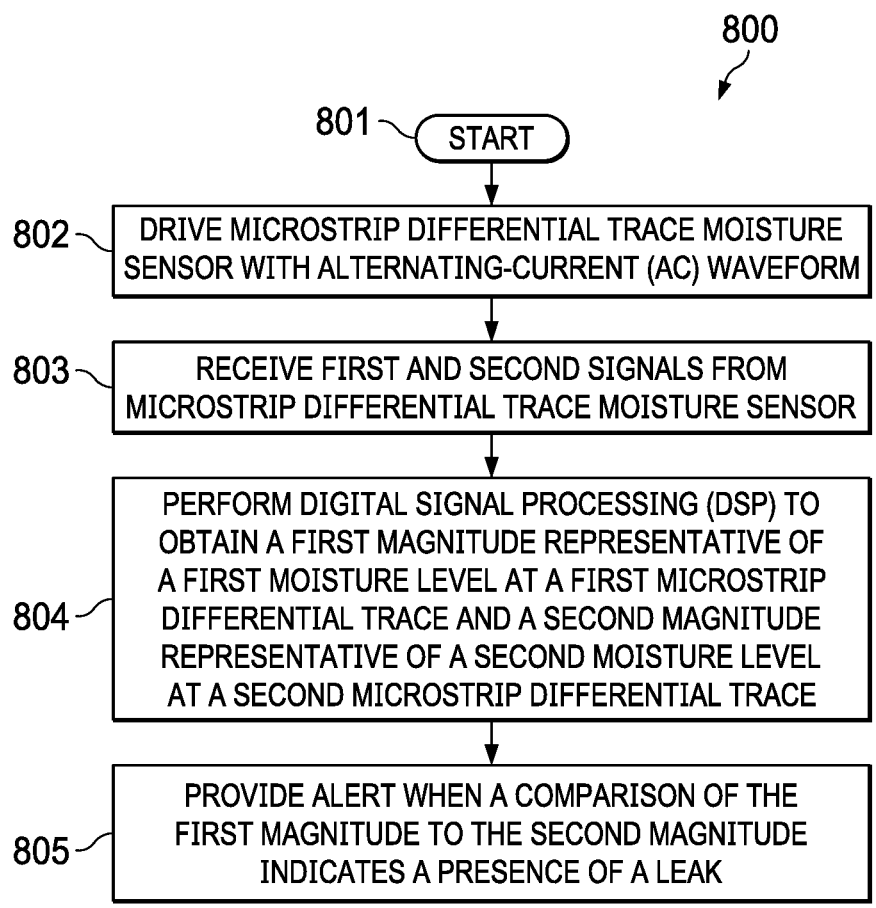
FIG. 8 is a flow diagram illustrating a method for digital leak detection, according to some embodiments.

FIG. 8 is a flow diagram illustrating a method for digital leak detection according to some embodiments. Method 800 begins at block 801 and continues to block 802. At block 802, a transmitter drives a microstrip differential trace moisture sensor with an AC waveform. As an example, the transmitter may drive the microstrip differential trace moisture sensing element with a square wave AC waveform. The square wave AC waveform may be modified, for example, using a low-pass filter. As an alternative, the differential trace moisture sensing element may be driven with an AC waveform of a different shape, such as a sine wave. As an example, the transmitter can drive both a first and a second microstrip differential trace moisture sensor.

From block 802, method 800 continues to block 803. At block 803, a first signal is received at a first receiver from a first microstrip differential trace moisture sensor and a second signal is received at a second receiver from a second microstrip differential trace moisture sensor. As an example, the first receiver and the second receiver may be separate receivers. As another example, the first and second receivers may be implemented by using a multiplexer to direct the respective signals to a common receiver. From block 803, method 800 continues to block 804.

At block 804, a processor performs digital signal processing (DSP) to obtain a first magnitude representative of a first moisture level at a first microstrip differential trace and a second magnitude representative of a second moisture level at a second microstrip differential trace. From block 804, method 800 continues to block 805. At block 805, the digital leak detection apparatus provides an alert when the comparison of the first magnitude to the second magnitude indicates the presence of a leak.

Figure 9A:
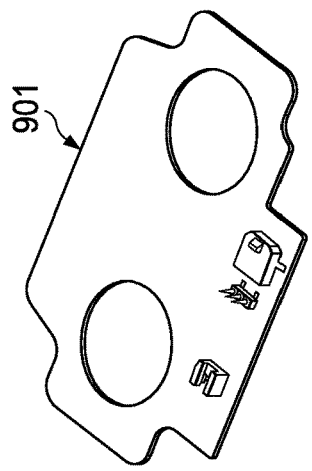
FIG. 9A is a perspective view of a leak sensor board usable with an IHS, according to some embodiments.

FIG. 9A is a perspective view of leak sensor board 901 usable with an IHS, according to some embodiments. Particularly, leak sensor board 910 includes any number of holes (in this case, two holes) configured to accommodate connections or fittings between a liquid cooling hose and a cold plate.

Figure 9B:
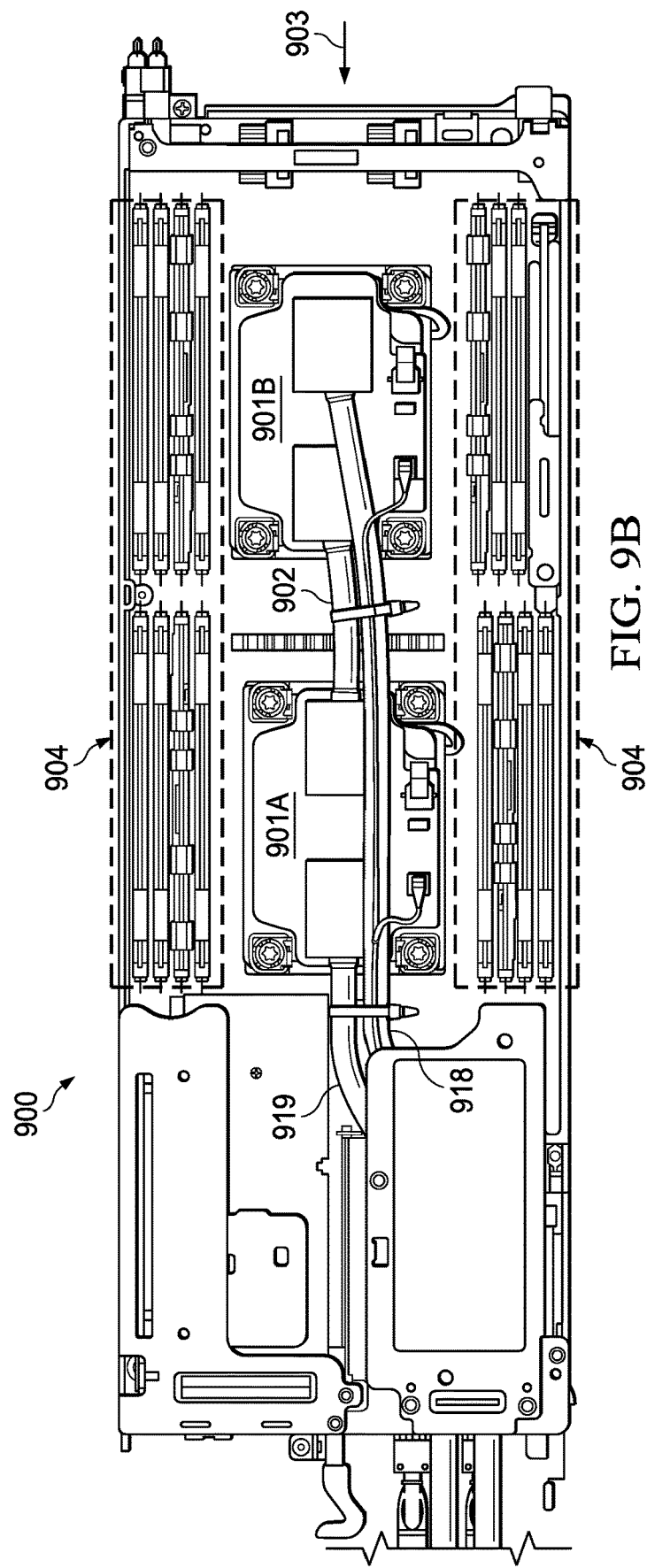
FIG. 9B is a top view of a riser card of an IHS with two leak sensor boards coupled to a liquid cooling subsystem, according to some embodiments.

FIG. 9B is a top view of a riser card of an IHS with two leak sensor boards coupled to a liquid cooling subsystem, according to some embodiments. Particularly, riser card 900 includes liquid cooling components such as: inlet hose 919, outlet hose 918, coupling hose 902, leak sensor board 901A, and leak sensor board 901B. Riser card 900 also includes DIMM areas 904, which air flow 903 is intended to cool down. Each of leak sensor boards 901A-B is a different instance of board 901 (in FIG. 9A), so that each board 901A-B has holes configured to accommodate a number of hose fittings.

Figure 10:
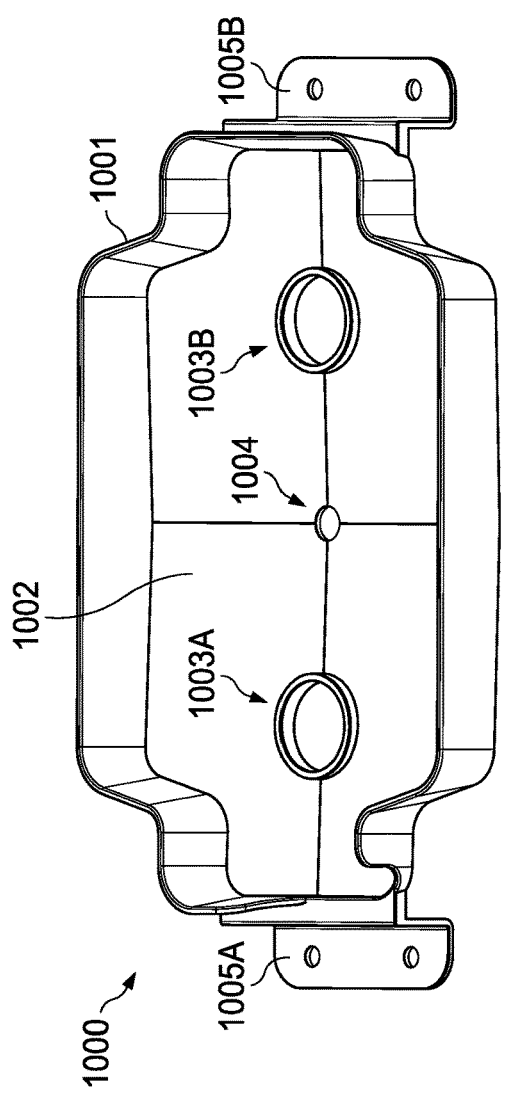
FIG. 10 is a perspective view of a drip tray, according to some embodiments.

FIG. 10 is a perspective view of drip tray 1000, according to some embodiments. Drip tray 1000 is generally rectangular and it includes an inside slant, concave surface 1002 surrounded by a perpendicular, lateral wall 1001 along the perimeter of surface 1002. First fitting hole 1003A and second fitting hole 1003B are openings in surface 1002 that are configured to accommodate hose fittings or connections.

Drain 1004 is yet another hole at the center of drip tray 1000 configured to collect liquid leaks at a focus or funnel point, and to deliver the collected fluid to a sensor (e.g., a microstrip differential trace moisture sensor) on a leak sensor board (not shown). Fitting holes 1003A-B may have a lip around their perimeter to prevent fluid from leaking through them, whereas drain hole 1004 may lack such a feature. Brackets 1005A-B allow drip tray 1000 to be fastened to riser card 900, to an IHS motherboard, or the like.

Figure 11:
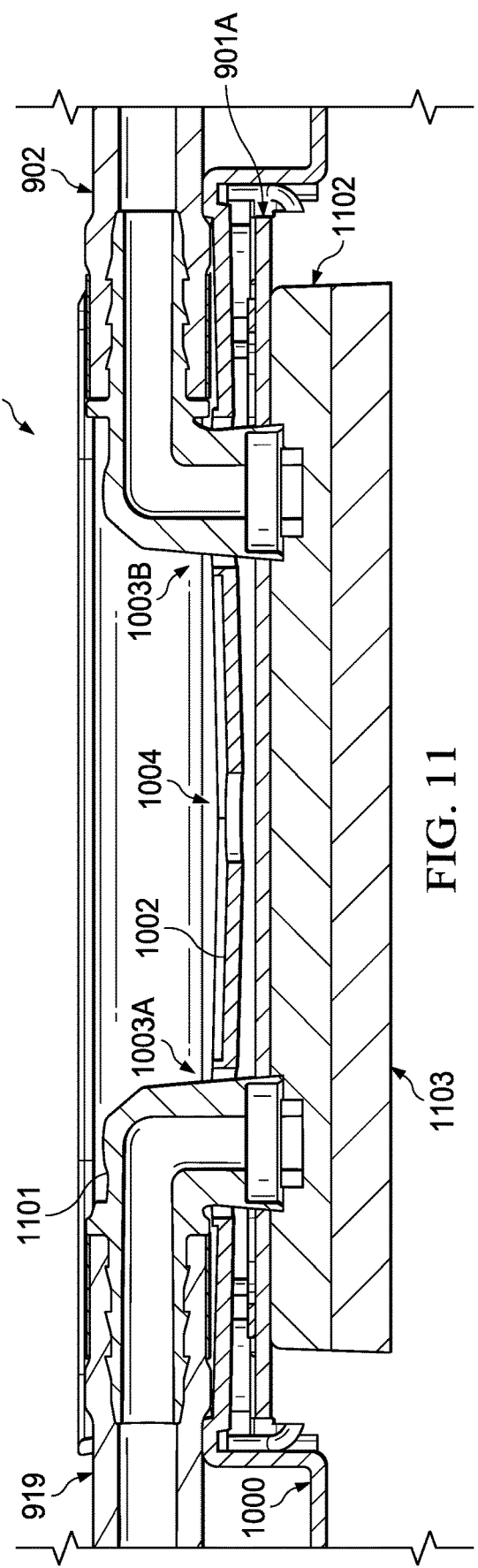
FIG. 11 is a sectional view of the drip tray assembled between a leak sensor board and hose fittings, according to some embodiments.

FIG. 11 is a sectional view of drip tray 1000 between leak sensor board 901A and hose fitting 1101 of inlet hose 919 to form assembly 1100, according to some embodiments. Particularly, cold plate 1102 sits on top of an IHS component 1103 (e.g., a processor, graphics card, RAM, etc.) to be liquid cooled, leak sensor board 901A is mounted on top of cold plate 1102, and drip tray 1000 is mounted on top of leak sensor board 901A. Drain 1004 of drip tray 1000 may be positioned over a sensing area of board 910A. Fittings from hoses 919 and 902 are located above drip tray 1000 and coupled to cold plate 1102 through holes 1003A and 1003B.

Each fitting 1101 may have a barb/tube joint area from which liquid is likely to leak during operation of the IHS. It should be noted that the low-profile implementation of assembly 1100 addresses potential stack height restrictions or design specifications.

Figure 12:
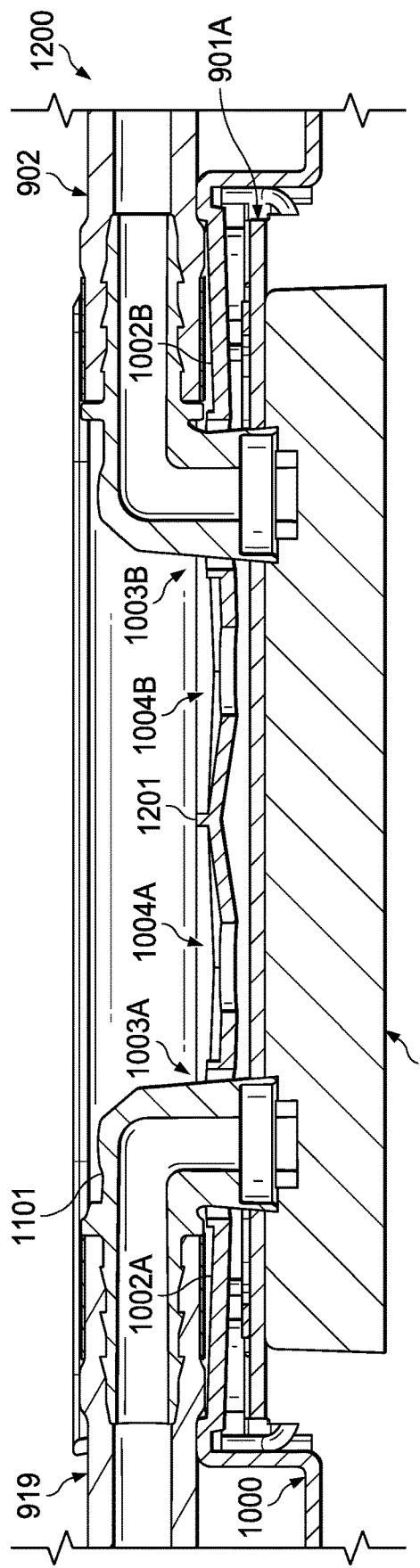
FIG. 12 is a sectional view of a drip tray with two drains, according to some embodiments.

FIG. 12 is a sectional view of drip tray 1200 with two drains 1004A and 1004B. In this embodiment, two concave surfaces 1002A and 1002B host fitting holes 1003A and 1003B, respectively. Drains 1004A and 1004B are separated by lip or barrier 1201. In this type of implementation, a fluid leak captured by concave surface 1002A is funneled to drain 1004A, whereas a fluid leak from captured by concave surface 1002B is funneled to drain 1004B.

When the underlying leak sensor board includes two distinct sensors or sensor areas, such that drain 1004A is located above a first sensor and drain 1004B is located above a second sensor, MCU 501 may be configured to identify a faulty fitting based upon which of the two sensors collected a given liquid leak. In other implementations, three or more concave surfaces and respective drains may be used in a single drip tray.

Figure 13:
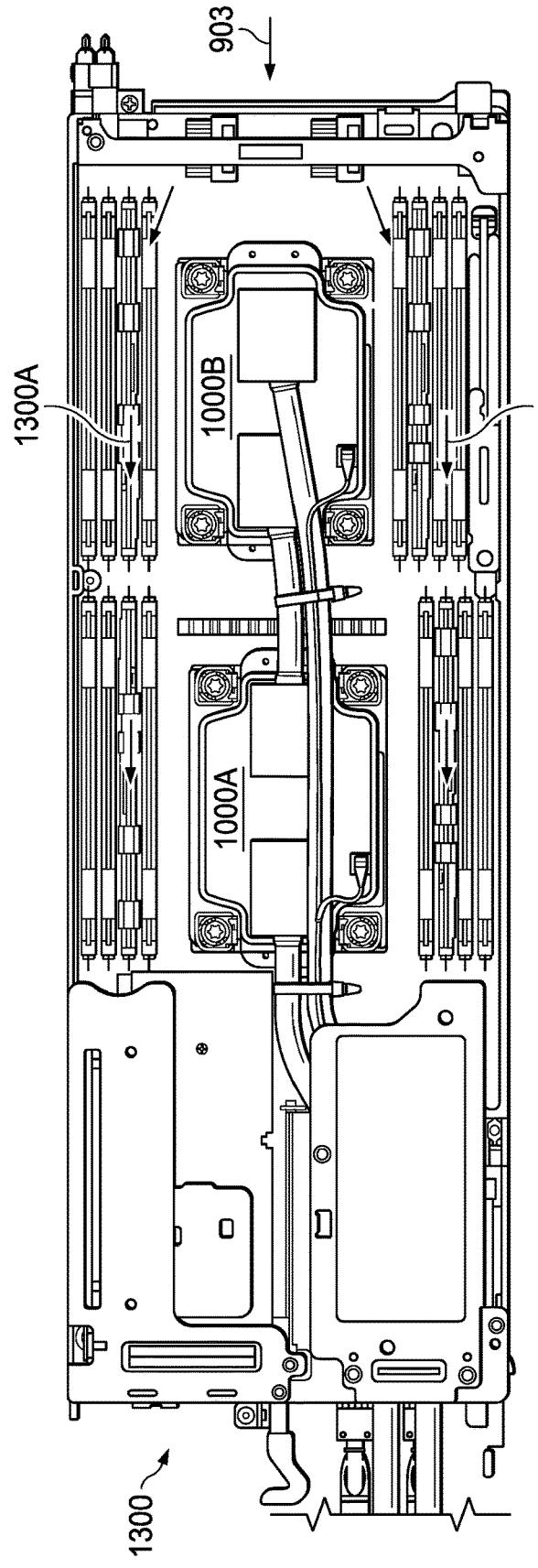
FIG. 13 is a top view of a riser card of an IHS with two drip trays used as air shrouds, according to some embodiments.

FIG. 13 is a top view of riser card 100 with two drip trays 1000A and 1000B used as air shrouds, according to some embodiments. As shown, air flow 903 is provided to riser card 100 by a fan or blower, and the lateral walls 1101 of drip trays 1000A-B operate as air shrouds, redistributing or redirecting air flow 903 into portions 1300A and 1300B along high-temperature areas (e.g., DIMM areas 904).

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS), comprising:
a component;
a cold plate disposed above the component;
a leak sensor board disposed above the cold plate; and
a drip tray disposed above the leak sensor board, wherein the drip tray is configured to capture a fluid leak from a fitting coupled to the cold plate, wherein the leak sensor board comprises a microstrip differential trace moisture sensor, and wherein the drip tray has a concave shape and comprises:
at least one hole configured to receive the fitting;
at least one drain configured to guide the fluid leak from the fitting toward the microstrip differential trace moisture sensor; and
at least another drain configured to guide another fluid leak from another fitting toward another microstrip differential trace moisture sensor.

2. The IHS of claim 1, wherein the drip tray further comprises a lateral wall configured to guide air flow from a fan into a dual in-line memory module (DIMM) area.

3. A drip tray, comprising:
a concave surface;
a hole configured to receive a fitting coupled to a cold plate;
a drain configured to guide a fluid leak from the fitting toward a leak sensor board disposed between the cold plate and the drip tray; and
a lateral wall configured to guide air flow from a fan into a dual in-line memory module (DIMM) area of an Information Handling System (IHS).

4. The drip tray of claim 3, wherein the leak sensor board comprises a microstrip differential trace moisture sensor.

5. The drip tray of claim 4, wherein the drain is configured to guide the fluid leak to the microstrip differential trace moisture sensor.

6. The drip tray of claim 5, further comprising another drain configured to guide another fluid leak from another fitting toward another microstrip differential trace moisture sensor on the leak sensor board.

7. In an Information Handling System (IHS), a method comprising:
　positioning a drip tray over a leak sensor board disposed atop a cold plate configured to cool a component of the IHS, wherein the drip tray has a concave shape, and wherein the leak sensor board comprises a microstrip differential trace moisture sensor;
　fastening the drip tray to the IHS; and
　coupling a fitting to the cold plate through a hole in the drip tray, wherein the drip tray is configured to capture a fluid leak from the fitting, and wherein the drip tray comprises:
　　at least one drain configured to guide the fluid leak toward the microstrip differential trace moisture sensor; and
　　at least another drain configured to guide another fluid leak from another fitting toward another microstrip differential trace moisture sensor.

8. The method of claim 7, wherein the drip tray further comprises a lateral wall configured to guide air flow from a fan into a dual in-line memory module (DIMM) area.

\* \* \* \* \*